United States Patent [19]
Han

[11] Patent Number: 5,322,749
[45] Date of Patent: Jun. 21, 1994

[54] PHASE SHIFT MASK AND METHOD OF MAKING THE SAME

[75] Inventor: O. Seok Han, Seoul, Rep. of Korea

[73] Assignee: Goldstar Electron Co., Ltd., Cheongju, Rep. of Korea

[21] Appl. No.: 976,020

[22] Filed: Nov. 13, 1992

[30] Foreign Application Priority Data

Nov. 15, 1991 [KR] Rep. of Korea .............. 20350/1991

[51] Int. Cl.$^5$ .............................................. G03F 9/00
[52] U.S. Cl. ........................................ 430/5; 430/396; 430/311
[58] Field of Search .................. 430/5, 22, 269, 311, 430/321, 369

[56] References Cited

U.S. PATENT DOCUMENTS

| | | | |
|---|---|---|---|
| 5,045,417 | 9/1991 | Okamoto | 430/5 |
| 5,208,125 | 5/1993 | Lowrey et al. | 430/5 |

FOREIGN PATENT DOCUMENTS

4006557 1/1992 Japan .

OTHER PUBLICATIONS

IEDM 90-821, Transparent Phase Shifting Mask-by H. Watanabe, Y. Todokoro, and M. Inoue, Kyoto Research Laboratory, Matsushita Electronics Corporation 19, Nishikujo-Kasugacho, Minami-ku, Koyto 601 Japan, pp. 33.2.1, 33.2.2, 33.2.3, 33.2.4.

**Handbook of VLSI Microlithography —Edited by William B. Glendinning (Nobleboro, Maine) and John N. Helbert (Advanced Technology Center) Mototola, Inc., Mesa, Arizona, pp. 352, 353, 354, 355, 356, 357, 364.

*Primary Examiner*—Steve Rosasco
*Attorney, Agent, or Firm*—Alan R. Loudermilk

[57] ABSTRACT

A phase shift mask comprising a light-transmitting substrate, a plurality of uniformly spaced phase shift regions formed over the light-transmitting substrate, and a plurality of light shield regions formed over the light-transmitting substrate, each of the light shield regions being disposed at opposite sides of the phase shift regions. Each light shield region has substantially the same thickness as the phase shift regions. The phase shift regions are made of a conductive metal, thereby requiring no additional conductive film for avoiding charging phenomena. The light shield regions are made of an inexpensive metal such as zinc, which typically is less expensive than materials such as chromium. Any environmental contamination caused by waste disposal or the like also may be avoided in that heavy metals such as chromium need not be used.

20 Claims, 11 Drawing Sheets

Fig. 10a
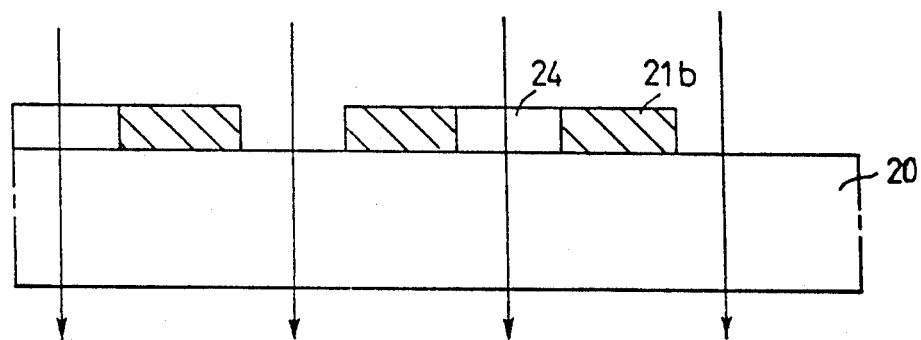
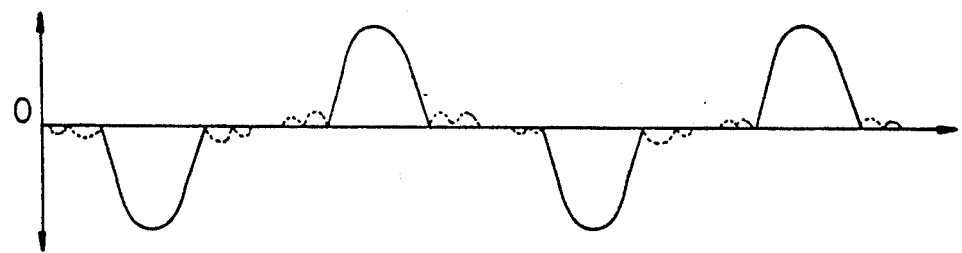
Fig. 10b

PHASE SHIFT MASK AND METHOD OF MAKING THE SAME

BACKGROUND OF INVENTION

1. Field of the Invention

The present invention relates to phase shift masks, and more particularly to a phase shift mask of a spatial frequency-modulated type and a method of making the same.

2. Description of the Prior Art

Presently, there is a requirement of masks for achieving hyperfine patterning of a submicron-grade, according to the trend of high integration of semiconductor devices. Phase shift masks have been developed as a technique for satisfying this requirement. The principle of such shift masks will now be described.

For manufacturing a phase shift mask, phase shift film 1 basically is necessary (see FIG. 1). The function of phase shift film 1 is to phase-shift the incident light, illustrated by the downward pointing arrows in FIG. 1. In FIG. 1, reference numeral 2 denotes a chromium layer as a light shield layer and reference numeral 3 denotes a light transmitting substrate made of, for example, quartz.

Referring to FIG. 2, graphs are illustrated that represent the amplitude of light through the mask. Graph "a" illustrates the amplitude of light with phase shift film 1 not present, whereas graph "b" illustrates the amplitude of light with phase shift film 1 present.

As illustrated in FIG. 2, the amplitude of light is phase-shifted by 180° by phase shift film 1.

Here, if the refractive index of phase shift film 1 is represented by n, and the thickness of phase shift film 1 is represented by d, and the refractive index of air is represented by no, the phase difference δ between graphs "a" and "b" of FIG. 2 can be expressed by the following equation:

$$\begin{aligned} \delta &= k \cdot n \cdot d - k \cdot no \cdot d \\ &= k \cdot (n - no)d \\ &= \frac{2\pi}{\lambda}(n-1)d \end{aligned} \quad (1)$$

In accordance with formula (1), phase difference δ should be 180° in order for the phase to be ideally shifted. If $\pi$ is substituted into formula (1) instead of the phase difference δ, the thickness d of phase shift film 1 to be appropriately shifted can be put into the following formula (2):

$$d = \frac{\lambda}{2(n-1)} \quad (2)$$

Now, a comparison of the above-mentioned phase shift mask with a general mask will be made with reference to FIGS. 3a through 4d.

FIG. 3a illustrates general pattern mask 4 disposed over substrate 5 in a parallel-aligned manner. FIG. 3b illustrates the amplitude of light out of mask 4. FIG. 3c illustrates the amplitude of light out of substrate 5. FIG. 3d illustrates the intensity of light out of substrate 5.

As shown in FIG. 3b, the amplitude of light out of adjacent openings of mask 4 constructively interfere with each other, thereby causing the amplitude and intensity differences of the transmitted light to be decreased as shown in FIGS. 3c and 3d. Such reduced amplitude and intensity differences result in an unclear distinction between dark portions and bright portions out of substrate 5.

Since the above effect is increased with hyperfine patterning, it is impossible to achieve submicron-grade patterning by using a general pattern mask such as mask 4.

FIG. 4a illustrates phase shift mask 7 having phase shift film 6 disposed between patterns of mask 4 in an aligned manner. FIG. 4b illustrates the amplitude of light out of the areas between the patterns of mask 4. FIG. 4c illustrates the amplitude of light out of substrate 5. FIG. 4d illustrates the intensity of light out of substrate 5.

In this case, the amplitude and intensity differences of the light are increased, as illustrated in FIGS. 4c and 4d. Accordingly, the distinction between dark portions and bright portions out of substrate 5 becomes more defined, so that hyperfine patterning may be advantageously performed.

Such phase shift masks may be classified as spatial frequency-modulated type, edge-emphasized type and shield effect-emphasized type, and these types of phase shift masks will be described with reference to FIGS. 5a to 5f.

FIG. 5a illustrates a spatial frequency-modulated type phase shift mask. The phase shift mask is made by forming a chromium film over quartz substrate 8, patterning the chromium film to form patterned chromium film 9, and forming phase shift film 10 between adjacent portions of patterned chromium film 9.

On the other hand, FIGS. 5b and 5c illustrate an edge-emphasized type phase shift mask. In particular, FIG. 5b illustrates a structure in which each portion of patterned chromium film 9 is surrounded by phase shift film 10, whereas FIG. 5c illustrates a structure in which phase shift film 10 is disposed over each portion of patterned chromium film 9.

FIGS. 5d and 5f illustrate a shield effect-emphasized type phase shift mask. In particular, FIG. 5d illustrates a structure in which phase shift film 10 is formed between adjacent patterned portions of chromium film 9. FIG. 5e illustrates a structure in which phase shift film 10 is disposed over and between two portions of chromium film 9, with chromium film 9 having been patterned and separated as shown in FIG. 5e. On the other hand, FIG. 5f illustrates a structure in which chromium film 9 is formed on portions of quartz substrate 8, which has been patterned and repeatedly etched to the predetermined depth to provide appropriate phase shifting as shown in FIG. 5f. The spatial frequency-modulated type phase shift masks, to which the present invention relates, will be described with reference to FIGS. 6a to 6g.

First, over glass substrate 11 is coated chromium layer 12, having a thickness of about 1,000 Å to 1,500 Å, and photoresist film 13, in this order, as shown in FIG. 6a.

Thereafter, photoresist film 13 is patterned to form a plurality of uniformly spaced photoresist patterns 13a, as shown in FIG. 6b.

Using photoresist patterns 13a as a mask, chromium layer 12 is subjected to an etching to form a plurality of uniformly spaced chromium patterns 12a, as shown in FIG. 6c. Subsequently, photoresist patterns 13a are removed.

Over the resultant entire exposed surface, light transmitting film 14 for defining a phase shift region is coated to have a predetermined thickness, as shown in FIG. 6d. Light transmitting film 14 may be made of silicon oxide, silicon-on-glass (SOG), or a polymer material.

Photoresist 15 is then deposited over light transmitting film 14, as shown in FIG. 6e.

As shown in FIG. 6f, photoresist 15 is selectively subjected to an exposure utilizing electron beams and then developed so that photoresist pattern 15a remains over a region defined as the phase shift region.

Using photoresist pattern 15a as a mask, light transmitting film 14 is then selectively subjected to an etching process to form phase shift region 14a, as shown in FIG. 6g. Thereafter, photoresist pattern 15a is removed.

Now, an effect of the conventional spatial frequency-modulated type phase shift mask manufactured as mentioned above will be described with reference to FIGS. 7a to 7c.

FIG. 7a is a sectional view of a phase shift mask manufactured according to a conventional technique, whereas FIGS. 7b and 7c illustrate the energy and intensity of light passing through the phase shift mask shown in FIG. 7a.

As shown in FIGS. 7b and 7c, the light passing through the phase shift region of the phase shift mask is phase-shifted as compared with the light passing through other portions of the phase shift mask at which the phase shift region is not present.

On the other hand, the intensity of light at the phase shift region is the same as that at other portions of the phase shift mask, as shown in FIG. 7c. Accordingly, the intensity of light transferring the mask shape to a wafer becomes high. That is, the phase shift angle of light is most ideal at 180° and can be adjusted by the refractive index of the material comprising the phase shift region and the thickness of the phase shift region.

However, the conventional spatial frequency-modulated phase shift mask encounters the following problems.

First, since a chromium pattern is used as a light shield and selectively etched, with the phase shift region disposed between and partially over adjacent portions of the chromium pattern, the overall processes are complex, thereby causing the quality of produced masks to deteriorate.

Second, since the phase shift region is a nonconductor, a conductive film should be provided for pattern printing utilizing electron beams so as to ground easily electrons generated at the surface of mask, thus avoiding charging at the surface. As a result, the number of steps in the overall process increases due to the addition of a process for forming a conductive film. Furthermore, when the conductive film is contaminated, regular light transmission may be impeded.

Third, it is difficult to adjust the thickness of light-transmitting phase shift region 14a and to provide a surface smoothness, since phase shift region 14a is deposited over chromium layer 12 as the light shield layer having a thickness of 1,000 Å to 1,500 Å, and a step may be formed between the glass substrate and the chromium layer, as illustrated in FIG. 8.

Fourth, there is a problem in etching the phase shift region material, since the phase shift region may be of a glass material which is coated over the substrate which may be of the same glass material, and then dry etched.

SUMMARY OF THE INVENTION

Therefore, an object of the present invention is to overcome the above-mentioned problems encountered in the prior art and to provide a phase shift mask and a method of making the same, wherein a light shield layer and a phase shift layer are formed to be in the same plane, thereby simplifying the manufacture and resulting in a smooth surface of the phase shift layer.

Another object of the present invention is to provide a phase shift mask and a method of making the same, wherein an inexpensive metal exhibiting a light transmission characteristic upon being oxidized is used as a phase shift layer material, thereby enabling the manufacturing cost to be reduced.

In one aspect, the present invention provides a phase shift mask comprising: a light-transmitting substrate; a plurality of uniformly spaced phase shift regions formed over the light-transmitting substrate; and a plurality of light shield regions formed over the light-transmitting substrate, each of the light shield regions being disposed at opposite sides of each phase shift region.

In another aspect, the present invention provides a method of making a phase shift mask comprising the steps of: preparing a light-transmitting substrate; forming a metal layer over the light-transmitting substrate; forming a first mask layer over the metal layer; patterning the first mask layer to form a plurality of uniformly spaced first mask patterns; implanting impurity ions in the metal layer under the condition of using the first mask patterns as a mask to define first regions in which no impurity ions are implanted; removing the first mask patterns and forming a second mask layer over the first and second regions; removing each portion of the second mask layer disposed over every other of the first region to form a plurality of uniformly spaced second mask patterns; etching the first regions under the condition of using the second mask patterns as a mask to remove every other of the first regions; and removing the second mask patterns and performing a heat treatment for converting each of the remaining first regions into a phase shift region.

BRIEF DESCRIPTION OF THE DRAWINGS

Other objects and aspects of the present invention will become apparent from the following description of embodiments with reference to the accompanying drawings in which:

FIG. 3b is a view illustrating the amplitude of light out of the mask shown in FIG. 3a;

FIG. 3c is a view illustrating the amplitude of light out of the substrate shown in FIG. 3a;

FIG. 3d is a view illustrating the intensity of light out of the substrate shown in FIG. 3a;

FIG. 4b is a view illustrating the amplitude of light out of the mask shown in FIG. 4a;

FIG. 4c is a view illustrating the amplitude of light out of the substrate shown in FIG. 4a;

FIG. 4d is a view illustrating the intensity of light out of the substrate shown in FIG. 4a;

FIGS. 10a and 10b are schematic views illustrating characteristics of the spatial frequency-modulated phase shift mask in accordance with the present invention.

DETAILED DESCRIPTION OF THE PREFERRED EMBODIMENTS

Referring to FIGS. 9a to 9h, there is illustrated a method of making a phase shift mask in accordance with the present invention.

In accordance with the present invention, first, over glass substrate 20 is deposited zinc layer 21 having a thickness of d as a phase shift layer, using a chemical vapor deposition process. The thickness d of the phase shift layer is determined by equation 2, discussed above.

Figure 1:
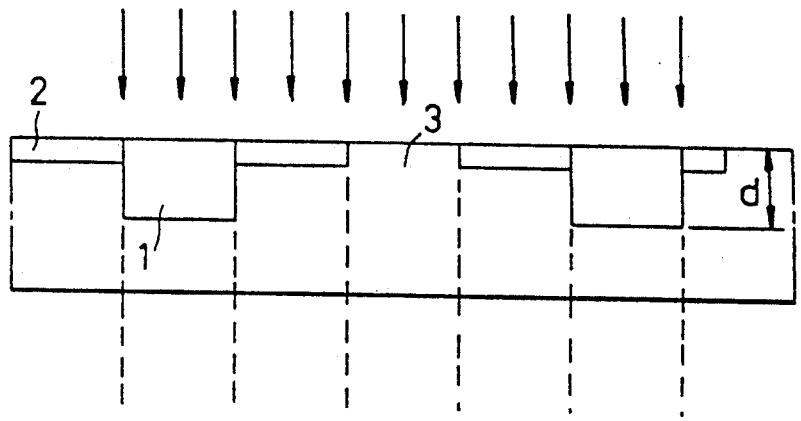
FIGS. 1 and 2 are schematic views explaining the principle of a phase shift mask.
Figure 2:
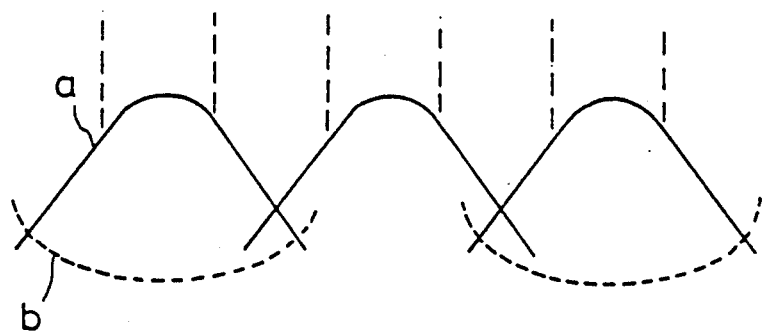
Figure 3A:
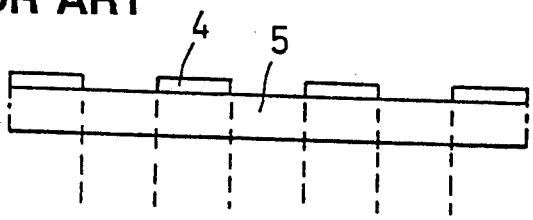
FIG. 3a is a sectional view of a mask with a general structure.
Figure 3B:
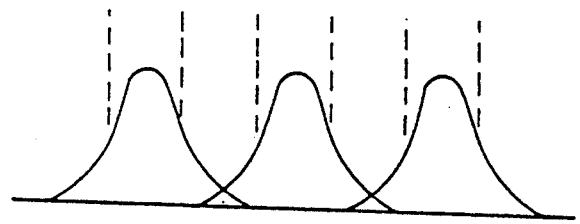
Figure 3C:
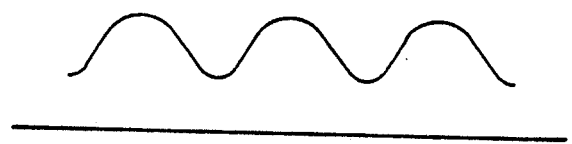
Figure 3D:
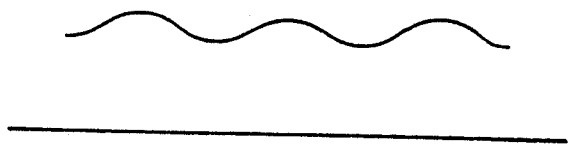
Figure 4A:
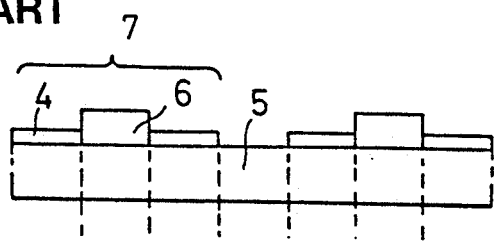
FIG. 4a is a sectional view of a phase shift mask with a general structure.
Figure 4B:
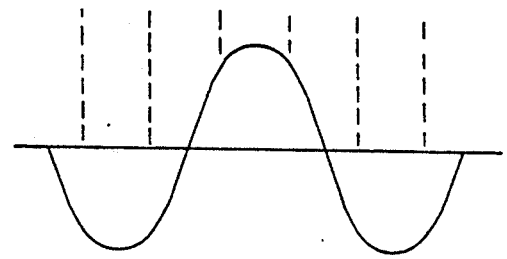
Figure 4C:
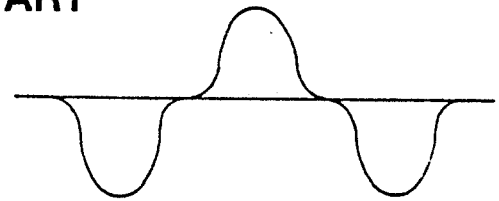
Figure 4D:
Figure 5A:
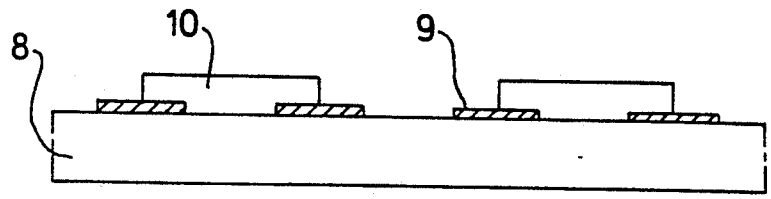
FIGS. 5a to 5f are sectional views of various types of phase shift masks.
Figure 5B:
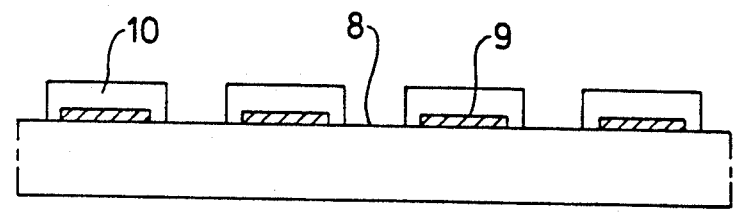
Figure 5C:
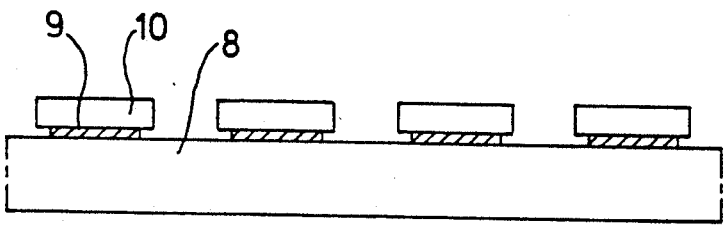
Figure 5D:
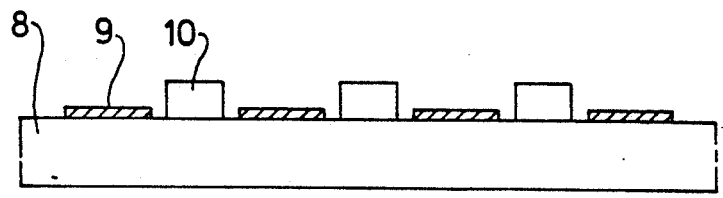
Figure 5E:
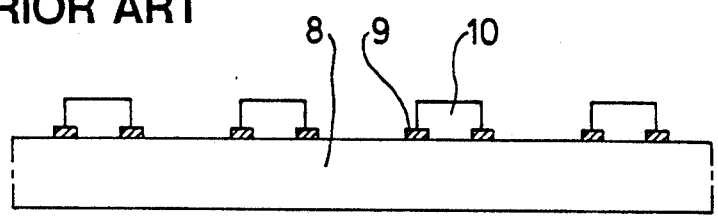
Figure 5F:
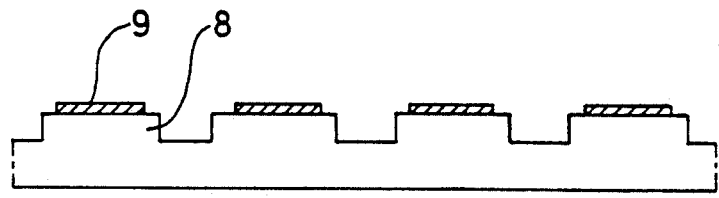
Figure 6A:
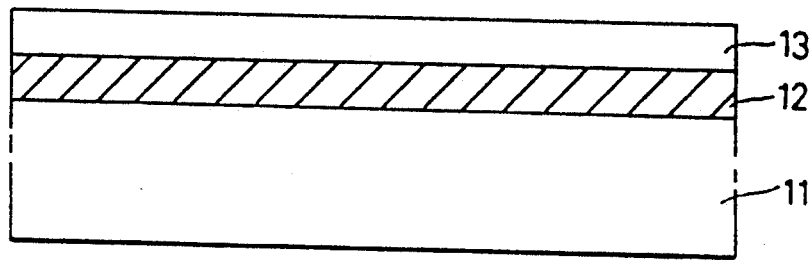
FIGS. 6a to 6g are sectional views illustrating a method of making a conventional spatial frequency-modulated phase shift mask.
Figure 6B:
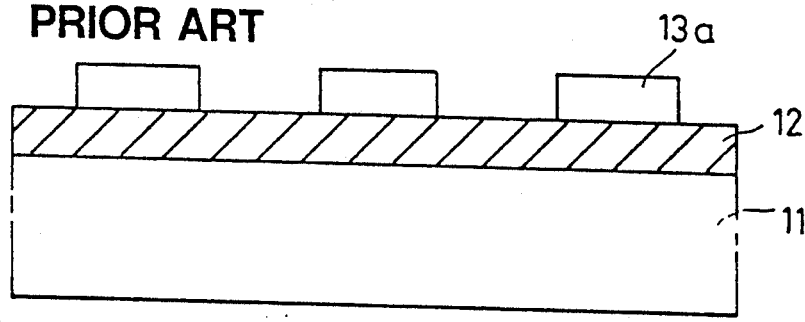
Figure 6C:
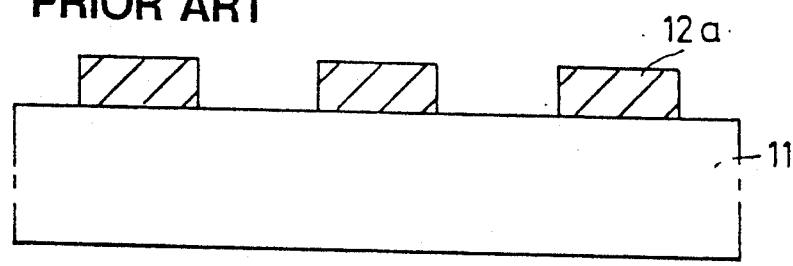
Figure 6D:
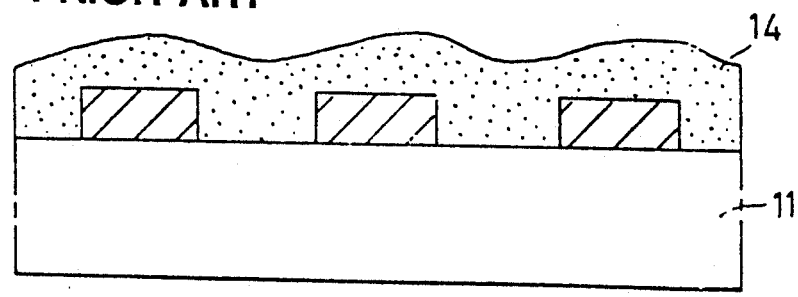
Figure 6E:
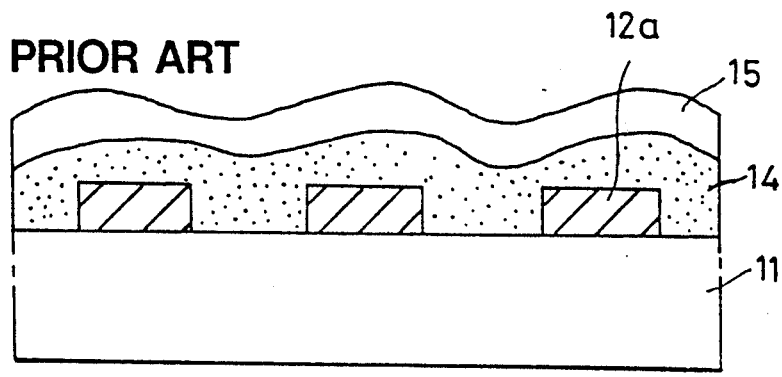
Figure 6F:
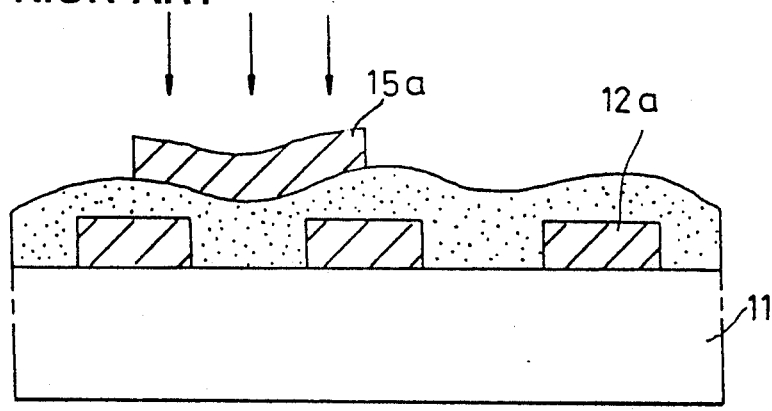
Figure 6G:
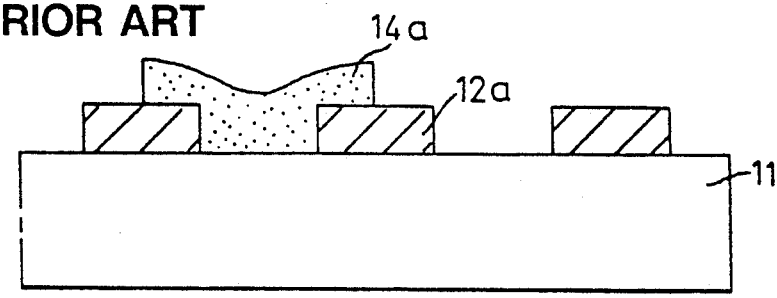
Figure 7A:
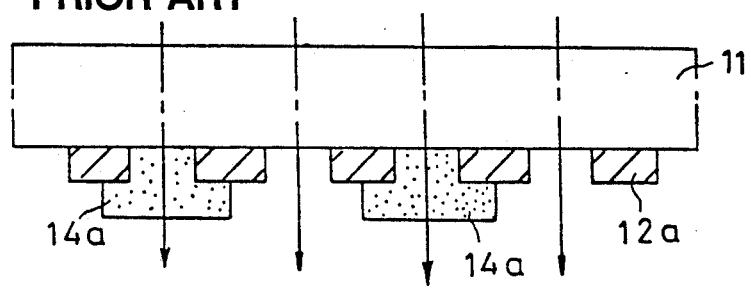
FIGS. 7a to 7c are schematic views showing characteristics of the conventional spatial frequency-modulated phase shift mask.
Figure 7B:
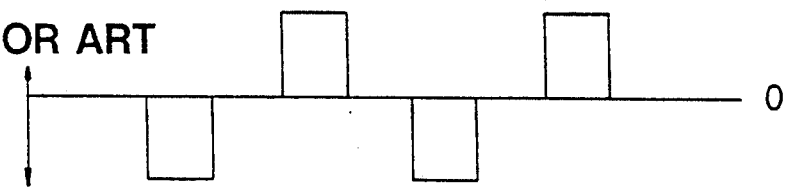
Figure 7C:
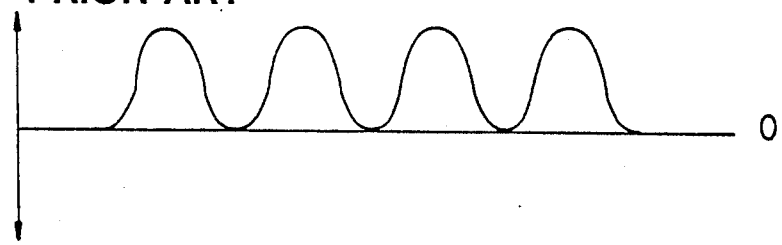
Figure 8:
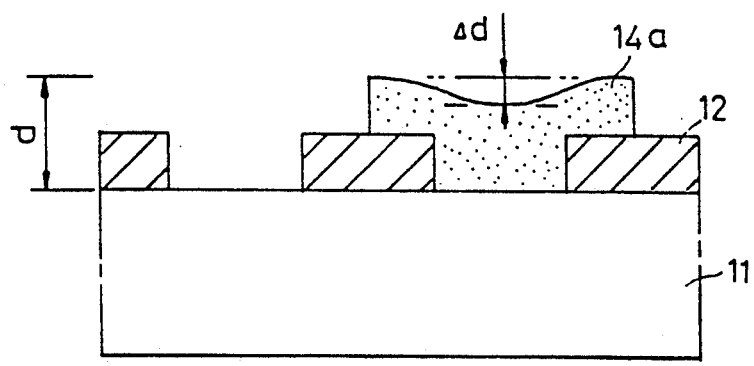
FIG. 8 is a schematic view illustrating a problem encountered with the conventional spatial frequency-modulated phase shift mask.
Figure 9A:
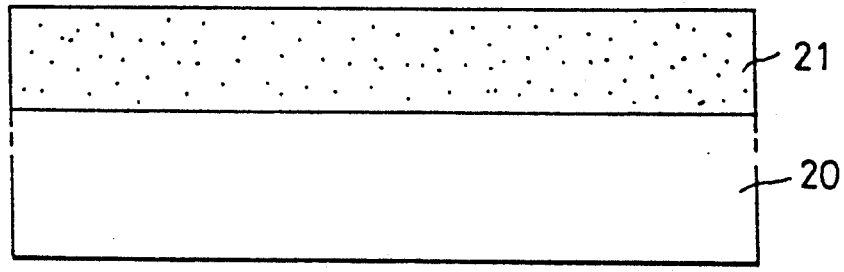
FIGS. 9a to 9h are sectional views illustrating a method of making a phase shift mask in accordance with the present invention.
Figure 9B:
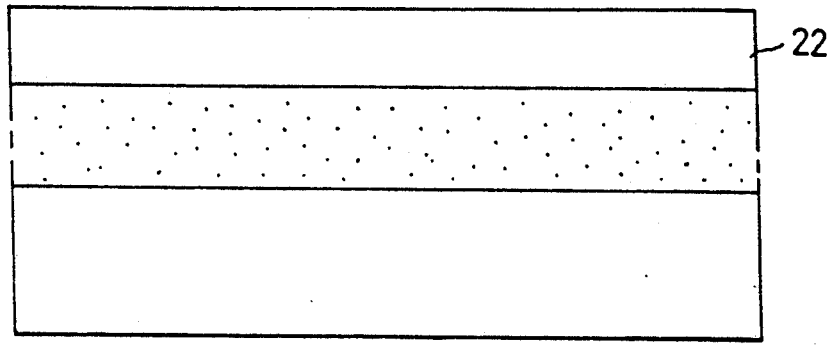

Thereafter, photoresist film 22 is coated over zinc layer 21, as shown in FIG. 9b.

Figure 9C:
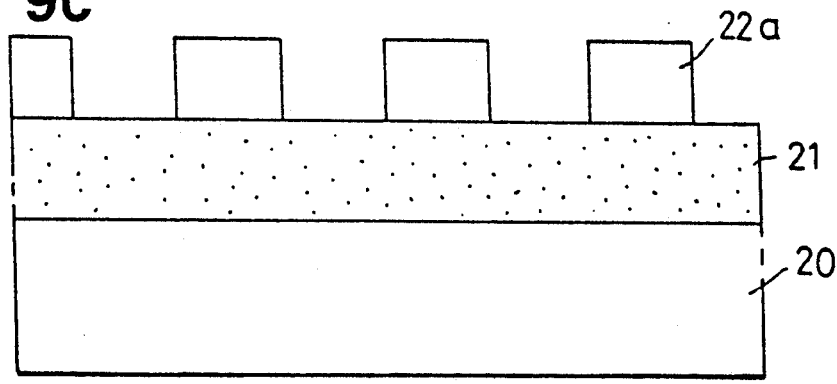

As shown in FIG. 9c, photoresist film 22 is subjected to an exposure using an electron beam device, so as to print a desired pattern thereon. Photoresist film 22 is then patterned to form a plurality of uniformly spaced photoresist patterns 22a.

Figure 9D:
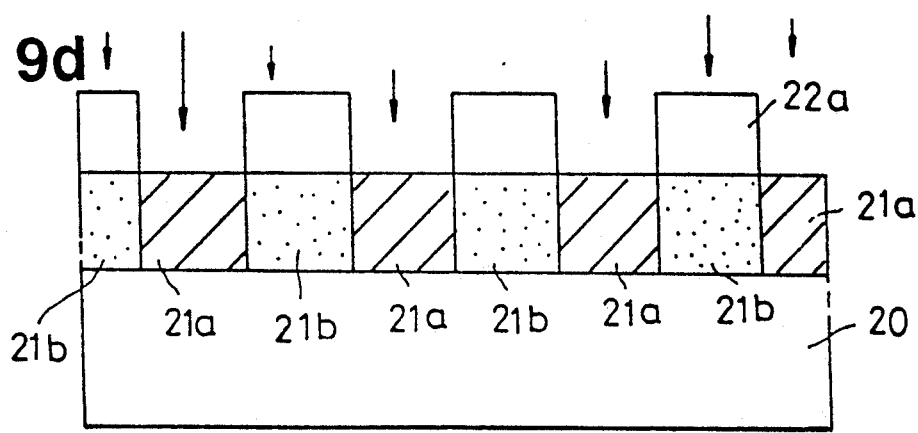

Thereafter, oxygen ions as impurity ions are implanted in each exposed portion of zinc layer 21 disposed between adjacent photoresist patterns 22a at a concentration of about $18 \times 10^{10}$ atoms/cm$^2$ or more, as illustrated in FIG. 9d. As a result, zinc layer 21 comprises a plurality of zinc regions 21a in which oxygen ions have been implanted, and a plurality of zinc regions 21b in which no oxygen ions have been implanted.

Figure 9E:
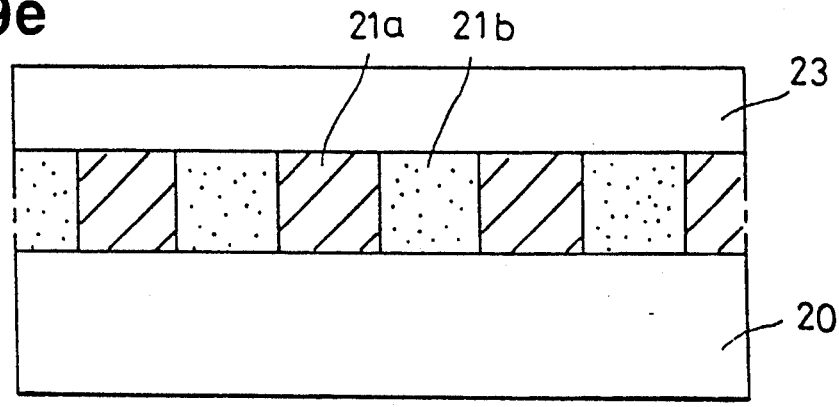

Photoresist patterns 22a are then removed, as shown in FIG. 9e. Thereafter, another photoresist film 23 is coated over the resultant entire exposed surfaces of zinc regions 21a and 21b.

Figure 9F:
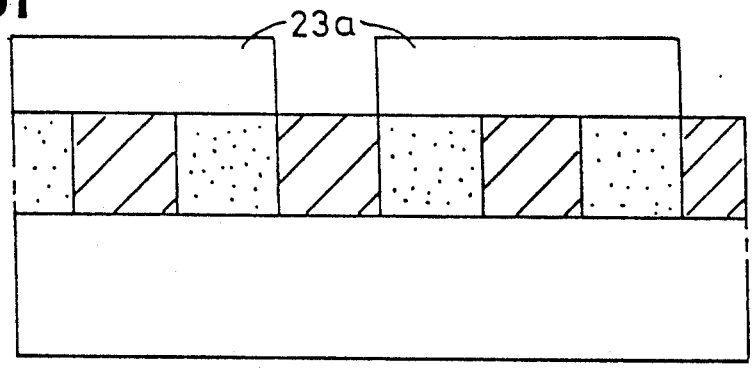

As shown in FIG. 9f, photoresist film 23 is subjected to patterning for removing portions of photoresist film 23 disposed over every other oxygen ion-implanted region 21a, thereby forming a plurality of photoresist patterns 23a.

Figure 9G:
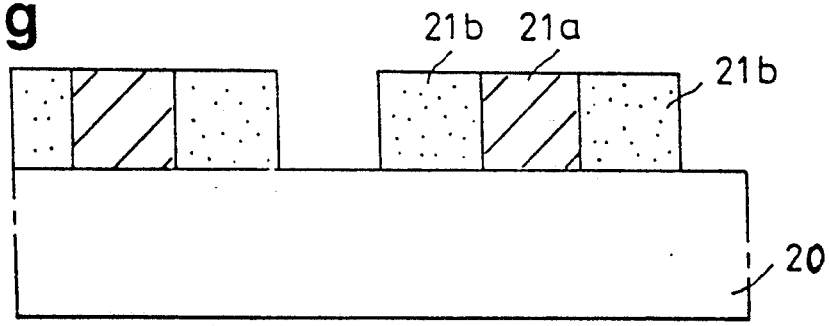

Using photoresist patterns 23a as a mask, oxygen ion-implanted regions 21a are selectively etched to remove every other one of oxygen ion-implanted regions 21a, as illustrated in FIG. 9g. Thereafter, photoresist patterns 23a are removed.

Figure 9H:
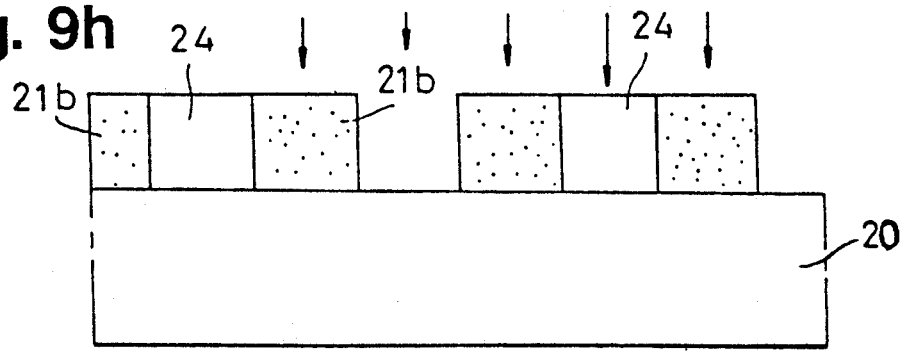

Subsequently, a heat treatment is carried out for converting the remaining oxygen ion-implanted regions 21a presented in zinc layer 21 into zinc oxide regions 24, as shown in FIG. 9h. The heat treatment is performed at a temperature of about 600° C. for about 20 minutes in an electric oven in which an oxygen or nitrogen atmosphere is maintained. Accordingly, a plurality of uniformly spaced phase shift masks are formed, each of which compromises zinc oxide region 24 and a pair of zinc regions 21b disposed at opposite sides of zinc oxide region 24.

Although the materials of the light shield layer and the phase shift regions compromise inexpensive zinc in the illustrated embodiment, they also may comprise other metals, for example, chromium. In case of using chromium, nitrogen ions may be used as the impurity ions. In place of glass, the substrate may be made of quartz. The phase shift region material may comprise a transparent material, for example, indium tin oxide (ITO), tin oxide (TO) or indium oxide (IO).

An effect of the phase shift mask manufactured according to the present invention will be now described with reference to FIGS. 10a and 10b.

As light is transmitted to respective portions of the phase shift mask as shown in FIG. 10a, light energy with the energy distribution shown in FIG. 10b is exhibited at portions out of the phase shift mask. That is, the phase of light passing through each portion of the upper surface of glass substrate 20 over which each zinc oxide region 24 as the phase shift layer is disposed is inverse to the phase of light passing through each exposed portion of the upper surface of glass substrate 20 over which the zinc oxide region 24 is not disposed. Accordingly, the energy distribution show in FIG. 10b is obtained.

As apparent from the above description, the present invention provides the following effects.

First, the manufacture of phase shift masks can be easily achieved in that the light shield region and the phase shift region are formed in the same plane.

Second, the surface smoothness of the phase shift layer may be improved.

Third, an additional conductive film for avoiding charging phenomenon may not be needed in that the zinc layer is a conductive layer.

Fourth, the manufacturing cost may be reduced in that the phase shift layer and the light shield layer may be made of zinc, which is less expensive than chromium.

Fifth, any environmental contamination caused by waste disposal or the like may be avoided in that heavy metals such as chromium need not be used.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A phase shift mask comprising:
   a light-transmitting substrate;
   a plurality of phase shift regions formed on the light-transmitting substrate; and
   a plurality of light shield regions formed on the light-transmitting substrate and in the same plane as the plurality of phase shift regions, each of the light shield regions being disposed on opposite sides of each phase sift region.

2. A phase shift mask in accordance with claim 1, wherein each of the phase shift regions has substantially the same width as each of the light shield regions;

3. A phase shift mask in accordance with claim 1, wherein the phase shift regions comprise zinc oxide.

4. A phase shift mask in accordance with claim 1, wherein the phase shift regions comprise a material selected from the group of silicon-on-glass (SOG) and silicon oxide.

5. A phase shift mask in accordance with claim 1, wherein the phase shift regions comprise a material selected from the group of indium tin oxide (ITO), indium oxide (IO) and tin oxide (TO).

6. A phase shift mask in accordance with claim 1, wherein the light-transmitting substrate comprises a material selected from the group of glass and quartz.

7. A phase shift mask in accordance with claim 1, wherein the light shield regions comprise a material selected from the group of chromium and zinc.

8. A method of making a phase shift mask on a light-transmitting substrate comprising the steps of:
    forming a metal layer on the light-transmitting substrate;
    forming a first mask layer on the metal layer;
    patterning the first mask layer to form a plurality of uniformly spaced first mask patterns;
    implanting impurity ions in the metal layer, wherein the first mask patterns serve as a mask, wherein impurity ions are implanted into first regions of the metal layer and no impurity ions are implanted into second regions of the metal layer;
    removing the first mask patterns;
    forming a second mask layer on the first and second regions;
    removing portions of the second mask disposed over every other one of the first regions, wherein a plurality of uniformly spaced second mask patterns are formed;
    etching the first regions to remove every other one of the first regions, wherein the second mask patterns serve as a mask;
    removing the second mask patterns; and
    performing a heat treatment for converting each of the remaining first regions into a phase shift region.

9. A method in accordance with claim 8, wherein the first regions have substantially the same width as the width of the second regions.

10. A method in accordance with claim 8, wherein the first and second mask layers comprise photoresist.

11. A method in accordance with claim 8, wherein the metal layer transmits light upon being oxidized.

12. A method in accordance with claim 11, wherein the metal layer is made of a metal selected from the group of indium-tin alloy, indium, tin, zinc and chromium.

13. A method in accordance with claim 8, wherein the impurity ions implanted into the metal layer are oxygen ions or nitrogen ions.

14. A method in accordance with claim 13, wherein the oxygen ions have a concentration of at least about $18 \times 10^{10}/cm^2$.

15. A method in accordance with claim 8, wherein the heat treatment is carried out at a temperature of above 600° C. for about 20 minutes in an atmosphere containing oxygen or nitrogen.

16. A method in accordance with claim 8, wherein the light-transmitting substrate comprises a material selected from the group of glass and quartz.

17. A method of masking a phase shift mask on a light-transmitting substrate comprising the steps of:
    forming a metal layer on the light-transmitting substrate;
    selectively implanting impurity ions into the metal layer, wherein impurity ions are implanted into first regions of the metal layer and no impurity ions are implanted into second regions of the metal layer;
    selectively removing every other one of the first regions; and
    converting the remaining first regions into phase shift regions.

18. A method in accordance with claim 17, wherein the metal layer transmits light upon being oxidized.

19. A method in accordance with claim 17, wherein the metal layer is comprised of a metal selected from the group of indium-tin alloy, indium, tin, zinc and chromium.

20. A method in accordance with claim 17, wherein the impurity ions implanted into the metal layer are oxygen ions or nitrogen ions.

* * * * *